US008624184B1

(12) United States Patent
Souza et al.

(10) Patent No.: US 8,624,184 B1
(45) Date of Patent: Jan. 7, 2014

(54) METHODS FOR SPATIALLY RESOLVED ALIGNMENT OF INDEPENDENT SPECTROSCOPIC DATA FROM SCANNING TRANSMISSION ELECTRON MICROSCOPES

(71) Applicant: Western Digital Technologies, Inc., Irvine, CA (US)

(72) Inventors: Guilherme Parente Souza, Pakkret (TH); Kurt Charles Ruthe, Bangkok (TH)

(73) Assignee: Western Digital Technologies, Inc., Irvine, CA (US)

( * ) Notice: Subject to any disclaimer, the term of this patent is extended or adjusted under 35 U.S.C. 154(b) by 0 days.

(21) Appl. No.: 13/688,098

(22) Filed: Nov. 28, 2012

(51) Int. Cl.
*H01J 37/28* (2006.01)

(52) U.S. Cl.
USPC ........... 250/307; 250/306; 250/310; 250/311; 250/492.3

(58) Field of Classification Search
USPC ........................ 250/306, 307, 310, 311, 492.3
See application file for complete search history.

(56) References Cited

U.S. PATENT DOCUMENTS

| 8,097,846 | B1 | 1/2012 | Anguelouch et al. | |
|---|---|---|---|---|
| 8,164,760 | B2 | 4/2012 | Willis | |
| 2008/0121804 | A1* | 5/2008 | Nakasuji et al. | 250/310 |
| 2011/0052019 | A1* | 3/2011 | Moshe | 382/128 |
| 2012/0262563 | A1* | 10/2012 | Marcelpoil et al. | 348/79 |

OTHER PUBLICATIONS

Williams, David B., Carter, C.B.; "Transmission Electron Microscopy: A Textbook for Materials Science"; 2nd Edition; Springer, NY; 2009; Chapter 1, pp. 3-22, "The Transmission Electron Microscope".
Williams, David B., Carter, C.B.; "Transmission Electron Microscopy: A Textbook for Materials Science"; 2nd Edition; Springer, NY; 2009; Chapter 39, pp. 715-739, "High Energy-Loss Spectra and Images".
Muller, David A.; "Structure and Bonding at the Atomic Scale by Scanning Transmission Electron Microscopy", Nature Materials; 2009; pp. 263-270; DOI: 10.1038/nmat2380.
Egerton, R.F.; "Electron Energy-Loss Spectroscopy in the Electron Microscope"; 3rd Edition; Springer, NY; 2011; Chapter 4, pp. 231-291, "Quantitative Analysis of Energy-Loss Data".

* cited by examiner

*Primary Examiner* — Michael Logie

(57) ABSTRACT

Methods for spatially resolved alignment of independent spectroscopic data from scanning transmission electron microscopes (STEMs) are provided. One such method includes performing a first scan of a first area of a first sample using a STEM configured to capture a first signal having a first image profile, performing a second scan of a second area of a second sample using the STEM configured to capture a second signal having a second image profile, selecting a subset region from one of the first and second profiles, correlating the selected subset region from the one of the first and second profiles and the other of the first and second profiles, and selecting, based on the correlating, a portion of the other of the first and second profiles such that the selected subset region and the portion of the other of the first and second profiles are about equal.

21 Claims, 6 Drawing Sheets

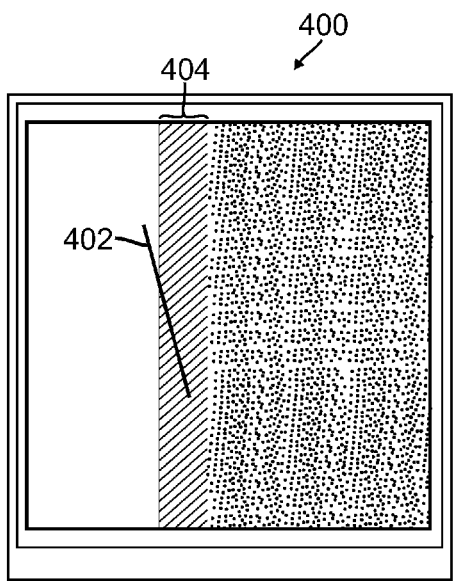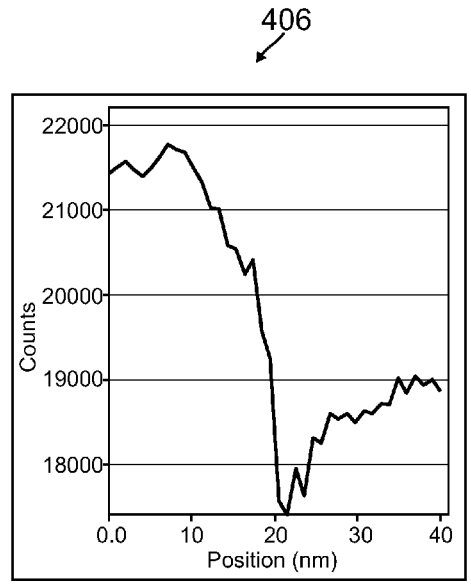
FIG. 9a  FIG. 9b
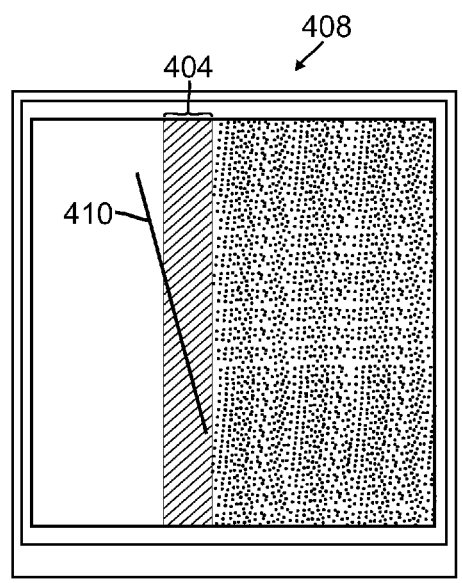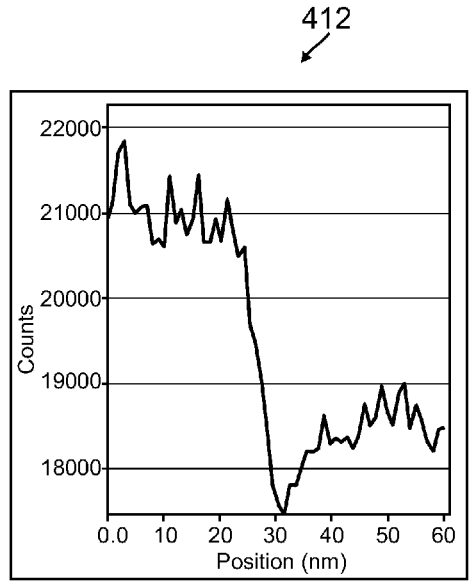
FIG. 10a  FIG. 10b

METHODS FOR SPATIALLY RESOLVED ALIGNMENT OF INDEPENDENT SPECTROSCOPIC DATA FROM SCANNING TRANSMISSION ELECTRON MICROSCOPES

FIELD

The present invention relates generally to processes for alignment of spectroscopic data, and more specifically, to methods for spatially resolved alignment of independent spectroscopic data from scanning transmission electron microscopes.

BACKGROUND

Transmission electron microscopy (TEM) has a number of applications including the analysis of components such as magnetic heads and media that are used in manufacturing disk drives. For example, the interaction of an electron beam with matter (e.g., a sample) generates a multitude of signals that can be acquired using transmission electron microscopy/microscope (TEM) with atomic spatial resolution, making it the most powerful spectroscopic and imaging tool currently available. Scanning TEM or STEM systems, where a probe forming beam with high spatial resolution scans over the sample to produce an image and to generate spectroscopic signals to be collected by the various detectors for spectroscopic studies of the fine chemical structure of magnetic materials, are of particular interest.

The STEM is the most commonly used tool to obtain directly interpretable, atomic resolution images from nanostructured materials. The most typical imaging mode in modern STEM systems is high angle annular dark field (HAADF), which is sensitive to atomic number and therefore reveals the so called atomic compositional contrast, or "Z-contrast", over the scanned region of the TEM lamella. Bright field and dark field detectors, which are sensitive to comparatively lower angle scattering and thus form a diffraction contrast image, are also common. In terms of spectroscopic analysis, the most common techniques found in commercial STEM's are X-ray energy dispersive spectroscopy (XEDS) and electron energy loss spectroscopy (EELS).

In order to achieve a thorough understanding of the sample, a feature of interest and/or a related failure mechanism, it is often the case that a combination of different analytical signals must be acquired with the highest signal-to-noise ratio possible. Although many signals arise from the interaction of the electron beam with the sample, in practice due to substantially different signal yields amongst the different spectroscopic techniques, it is generally not possible to perform simultaneous spectroscopic acquisitions which are optimized to get the best signal from the respective techniques. As such, artifacts from over-saturated or under-saturated detectors and excessive beam exposure to the specimen are unavoidable in simultaneous spectroscopic experiments.

The most state-of-the-art transmission electron microscopes allow for simultaneous acquisition of EELS and XEDS signals, but there is no known technology for simultaneous acquisition of any of the other of the multitude of spectroscopic and imaging signals available from the STEM. Furthermore, while technology exists to collect both the zero-loss and core-loss regions of the EELS spectra simultaneously, the so-called dual-EELS, there is currently no known technology which allows for the combination or simultaneous acquisition of dual-EELS and XEDS or any other spectra. Thus, the various spectroscopic signals are acquired independently from separately optimized experiments. At this point, however, the spatial correlation between the different spectroscopic experiments becomes irreversibly lost. As such, a method for spatially resolving the alignment of independent spectroscopic data from scanning transmission electron microscopes is needed.

SUMMARY

Aspects of the invention relate to methods for spatially resolved alignment of independent spectroscopic data from scanning transmission electron microscopes. In one embodiment, the invention relates to a method for spatially resolving an alignment of spectroscopic data from a scanning transmission electron microscope, the method including performing a first scan of a first preselected area of a first sample using a scanning transmission electron microscope configured to capture a first preselected signal having a first image profile, performing a second scan of a second preselected area of a second sample using the scanning transmission electron microscope configured to capture a second preselected signal having a second image profile, selecting a subset region of interest from one of the first and second image profiles, correlating the selected subset region of interest from the one of the first and second image profiles and the other of the first and second image profiles, where the selected subset region of interest is smaller than the other of the first and second image profiles, and selecting, based on the correlation, a portion of the other of the first and second image profiles such that the selected subset region of interest and the portion of the other of the first and second image profiles are about equal.

BRIEF DESCRIPTION OF THE DRAWINGS

FIG. 2b is a graph of a gray level profile corresponding to the STEM line scan of FIG. 2a.

FIG. 3b is a graph of a gray level profile corresponding to the STEM line scan of FIG. 3a.

FIG. 4b is a graph of a gray level profile corresponding to the STEM line scan of FIG. 4a.

FIG. 5b is a graph of a gray level profile corresponding to the STEM line scan of FIG. 5a.

FIG. 6b is a graph of a gray level HAADF profile corresponding to the STEM line scan of FIG. 6a.

FIG. 9a is a snapshot of a scanning transmission electron microscopy line scan of a portion of a magnetic head using the high angle annular dark field (HAADF) detector of the STEM, where a reference line with a preselected length has been placed such that it crosses a diamond like carbon (DLC) layer of the magnetic head to analyze the carbon edge structure in accordance with one embodiment of the invention.

FIG. 9b is a graph of a gray level profile corresponding to the STEM line scan of FIG. 9a.

FIG. 10a is a snapshot of a scanning transmission electron microscopy line scan of the portion of the magnetic head of FIG. 9a using the high angle annular dark field (HAADF) detector of the STEM, where a second reference line with a preselected length greater than that of FIG. 9a has been placed such that it crosses the same diamond like carbon (DLC) layer as in FIG. 9a of the magnetic head to analyze the carbon edge structure in accordance with one embodiment of the invention.

FIG. 10b is a graph of a gray level profile corresponding to the STEM line scan of FIG. 10a.

DETAILED DESCRIPTION

Figure 1:
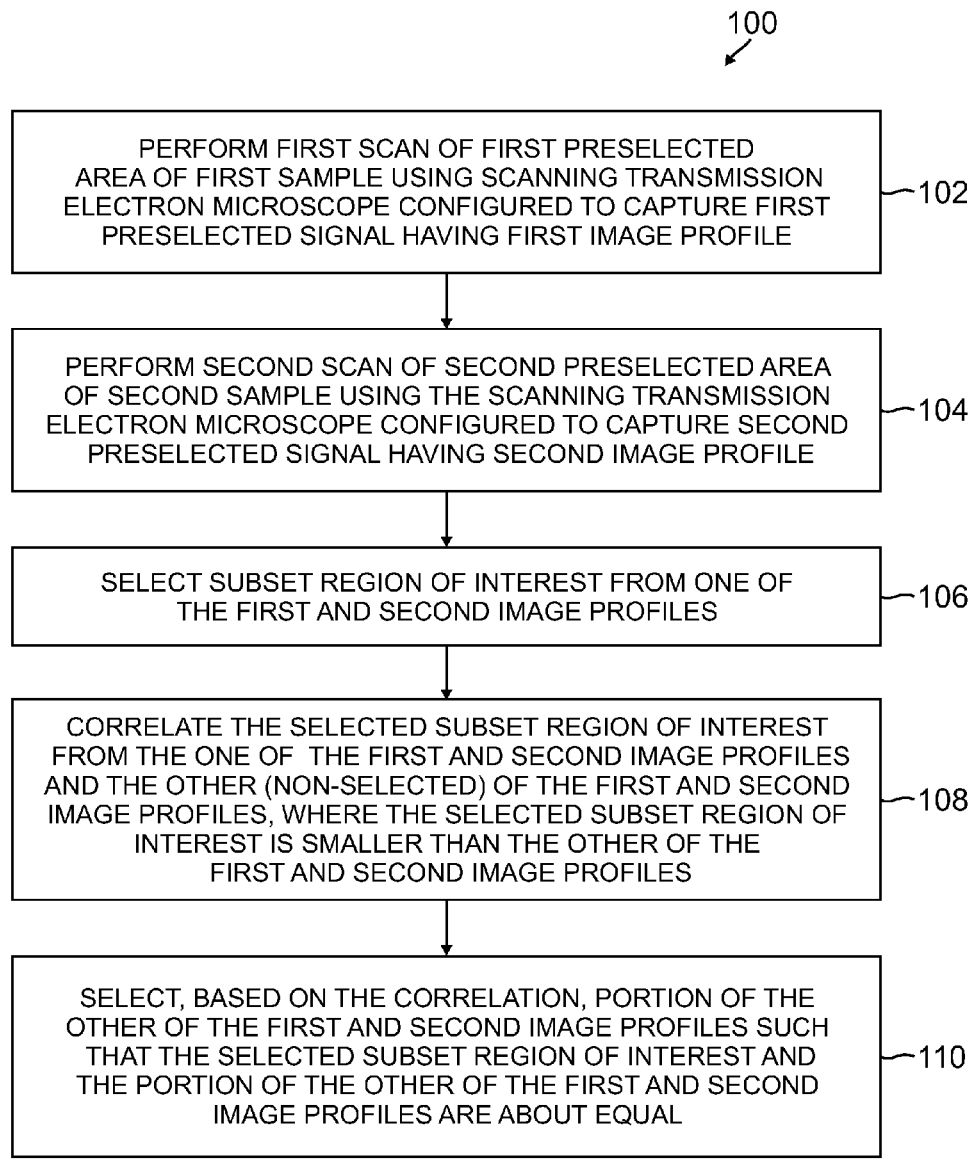
FIG. 1 is a flowchart of a process for spatially resolved alignment of independent spectroscopic data from a scanning transmission electron microscope in accordance with one embodiment of the invention.

Referring now to the drawings, embodiments of methods for spatially resolved alignment of independent spectroscopic data from scanning transmission electron microscopes are illustrated. In many embodiments, the alignment methods involve exploiting the fact that one can utilize the imaging detector signal (in the form of a gray level profile) produced during two (or more) separate line scans over the same area as a means to recombine those two line scans, in an extra step, aiming at analyzing spectroscopic data from both line scans together. An extension to this approach involves utilizing the gray level profiles produced at different regions of the sample, but over features of the same kind (e.g., a film stack or other suitable feature). The same approach can be further extended to different samples. The rationale for different samples is expected to be effective for very regular features such as film stacks, since line scans containing image contrast information would be successfully correlated, which may not be the case for features that present a rather non-uniform and variable interface.

In several embodiments, the alignment methods involve performing a first scan of a first preselected area of a first sample using a scanning transmission electron microscope configured to capture a first preselected signal having a first image profile, and performing a second scan of a second preselected area of a second sample using the scanning transmission electron microscope configured to capture a second preselected signal having a second image profile. The methods then involve selecting a subset region of interest from one of the first and second image profiles, and correlating the selected subset region of interest and the other of the first and second image profiles (e.g., the non-selected image profile), where the selected subset region of interest is smaller than the non-selected image profile of the first and second image profiles. The methods then involve selecting, based on the correlation, a portion of the non-selected image profile such that the selected subset region of interest and the portion of the non-selected image profile are about equal. In a number of embodiments, the first and second samples are the same and the first and second signals are either of XEDS or EELS signals. In some embodiments, the first and second scans are line scans and the first and second areas of the samples are the same.

In essence, embodiments of the invention address the problems described above in the background section by demonstrating how information from a STEM imaging detector, such as the high-angle annular dark field detector, which is common to all spectroscopic techniques in the STEM, can be used to recover the spatial correlation and yield high spatial resolution, correlated spectroscopic data from any number of data sets acquired in the STEM. Spectroscopic signals can always be acquired in parallel with the HAADF image signal. The detection of X-rays does not depend on the imaging detector (e.g. HAADF), as the XEDS detector can be dependent thereon, and usually is placed near the sample above the imaging detector.

As to the specific problem at hand, the applicants have observed that if a combined experiment involving both XEDS and EELS is performed on a sample (e.g., XEDS and EELS), the result often gives poor signal-to-noise ratio for the XEDS due to lower X-ray yields compared to electron energy loss yields. X-ray counts for the elements identified are markedly low, whereas the EELS signal has very high counts. If it is desired to acquire signals for both EELS and XEDS with suitable signal-to-noise ratios for each technique, it appears that two separate experiments with different experimental parameters (e.g. different dwell times) must be conducted from separate acquisitions. However, once the first separate experiment is completed, thermally-induced sample drift will move the sample holder with the region of interest away from the position the line scan was originally drawn, thus irreversibly destroying the spatial correlation of the experiment. This is a central problem that this invention addresses.

Another example of multiple spectroscopic experiments which appear to require separate performance include quantitative EELS, where both the low-loss (including the zero loss peak or ZLP) regime and the core loss (of interest) regimes of the spectra must be acquired in order to perform true quantification. Simultaneous collection of both ZLP and core-loss with suitable signal-to-noise ratio is apparently not possible since the dwell times required for reasonable signal-to-noise ratio edge data would saturate the charge coupled device (CCD) type detector in the EELS spectrometer due to the presence of high intensity ZLP signal. Therefore, in order to perform deconvolution of the plural scattering and to produce a corrected edge spectrum, it appears that one must collect the ZLP information separately from the edge information, each time with a different dwell time for optimized acquisition while protecting the CCD. Embodiments of the methods for spatially resolved alignment of independent spectroscopic data from scanning transmission electron microscopes address these more specific problems as well.

FIG. 1 is a flowchart of a process 100 for spatially resolved alignment of independent spectroscopic data from a scanning transmission electron microscope in accordance with one embodiment of the invention. In particular embodiments, the process 100 can be used in conjunction with the samples and corresponding STEM line scans described in the subsequent portions of this application. The process performs (102) a first scan of a first preselected area of a first sample using a scanning transmission electron microscope configured to capture a first preselected signal having a first image profile. The process then performs (104) a second scan of a second preselected area of a second sample using the scanning transmission electron microscope configured to capture a second preselected signal having a second image profile.

In several embodiments, the first sample and the second sample are the same. In one such case, the first area of the sample is the same as the second area of the sample. In another such case, the first area of the sample is different from the second area of the sample. In some embodiments, the first sample and the second sample contain a number of common features. In several embodiments, the first scan and the second scan are line scans. In other embodiments, the first scan and the second scan can be a point scan, an area scan, or another suitable scan. In several embodiments, the first and second signals are either XEDS signals, EELS signals, convergent beam electron diffraction (CBED) signals, or other similar signals that can be acquired using STEMs in any conceivable combination. In several embodiments, the first preselected area and the second preselected area are intrinsic features of the respective samples. In other embodiments, the first preselected area and the second preselected area are non-intrinsic features (e.g., fiducial marks) of the respective samples.

After block 104, the process then selects (106) a subset region of interest from one of the first and second image profiles. In several embodiments, the subset region is selected from the smaller of the first and second image profiles. The process then correlates (108) the selected subset region of interest from the one of the first and second image profiles and the other of the first and second image profiles, where the selected subset region of interest is smaller than the other of the first and second image profiles.

The process then selects (110), based on the correlating, a portion of the other (e.g., the non-selected one) of the first and second image profiles such that the selected subset region of interest and the portion of the other of the first and second image profiles are about equal. In some embodiments, the process generates an error matrix indicative of a degree of correlation between the selected one of the first and second image profiles and the other (e.g., non-selected one) of the first and second image profiles. In one such embodiment, the process repeats the process actions until the error matrix is less than a preselected value. In another embodiment, the process repeats the process actions until the error matrix is the minimum.

In some embodiments, the first sample and the second sample are the same sample and the first preselected area and the second preselected area are the same area. In one such case, the process also compares a spectroscopic information of the selected subset region of interest with a spectroscopic information of the selected portion of the other of the first and second image profiles, and then generates a compositional profile of the first preselected area of the first sample based on the results of the comparison.

In some embodiments, the first scan is a first line scan with a first spatial resolution, and the second scan is a second line scan with a second spatial resolution. In one such case, the first spatial resolution is equal or about equal to the second spatial resolution. In another such case, the first spatial resolution is not equal to the second spatial resolution.

In one embodiment, the process can perform the sequence of actions in a different order. In another embodiment, the process can skip one or more of the actions. In other embodiments, one or more of the actions are performed simultaneously. In some embodiments, additional actions can be performed.

Figure 2A:
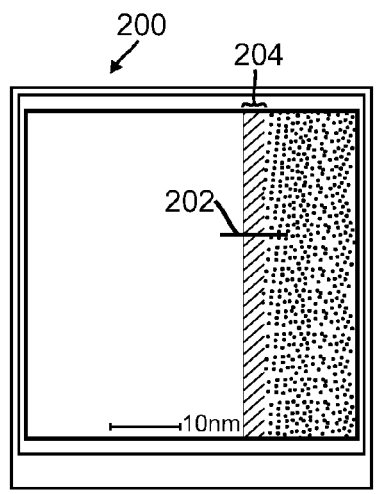
FIG. 2a is a snapshot of a scanning transmission electron microscopy line scan of a portion of a magnetic head using the high angle annular dark field (HAADF) detector of the STEM, where a reference line with a preselected length has been placed such that it crosses a preselected feature (e.g., thin film stack) of the magnetic head in accordance with one embodiment of the invention.

FIG. 2*a* is a snapshot of a scanning transmission electron microscopy line scan 200 of a portion of a magnetic head using the high angle annular dark field (HAADF) detector of the STEM, where a reference line 202 with a preselected length has been placed such that it crosses a preselected feature (e.g., thin film stack) 204 of the magnetic head in accordance with one embodiment of the invention.

Figure 2B:
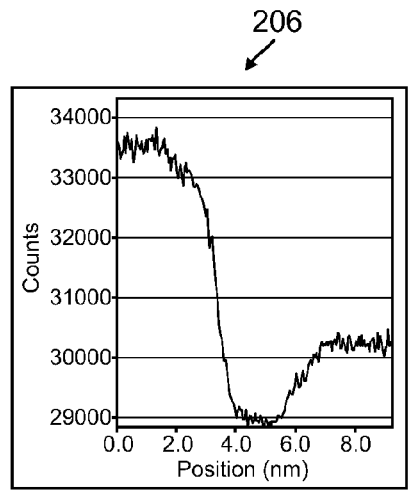

FIG. 2*b* is a graph of a gray level profile 206 corresponding to the STEM line scan 200 of FIG. 2*a*.

Figure 3A:
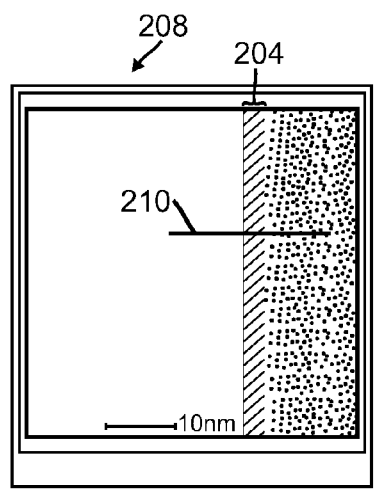
FIG. 3a is a snapshot of a scanning transmission electron microscopy line scan of the portion of the magnetic head of FIG. 2a using the high angle annular dark field (HAADF) detector of the STEM, where a second reference line with a preselected length longer than that of FIG. 2a has been placed such that it crosses the same preselected feature (e.g., thin film stack) of the magnetic head at the same location as the reference line of FIG. 2a in accordance with one embodiment of the invention.

FIG. 3*a* is a snapshot of a scanning transmission electron microscopy line scan 208 of the portion of the magnetic head of FIG. 2*a* using the high angle annular dark field (HAADF) detector of the STEM, where a second reference line 210 with a preselected length longer than that of FIG. 2*a* has been placed such that it crosses the same preselected feature (e.g., thin film stack) 204 of the magnetic head at the same location as the reference line 202 of FIG. 2*a* in accordance with one embodiment of the invention.

Figure 3B:
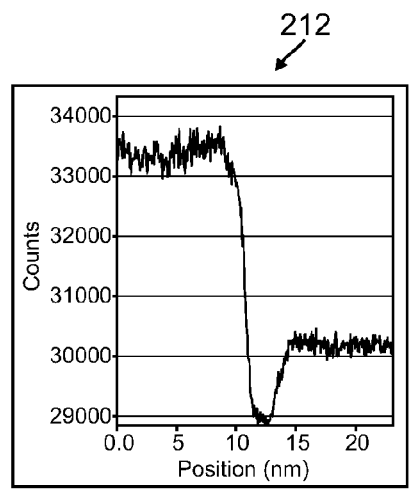

FIG. 3*b* is a graph of a gray level profile 212 corresponding to the STEM line scan 208 of FIG. 3*a*.

Figure 4A:
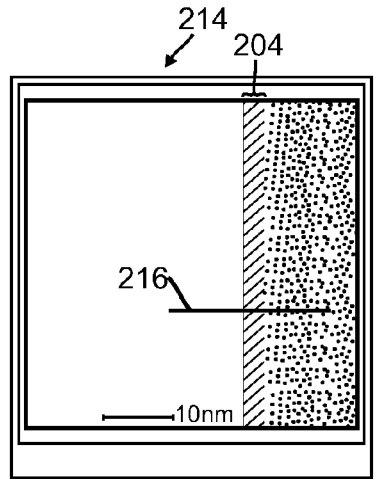
FIG. 4a is a snapshot of a scanning transmission electron microscopy line scan of the portion of the magnetic head of FIG. 2a using the high angle annular dark field (HAADF) detector of the STEM, where a third reference line with a preselected length substantially the same as that of FIG. 3a has been placed such that it crosses the same preselected feature (e.g., thin film stack) of the magnetic head at a different location than the location of the reference lines of FIG. 2a and FIG. 3a in accordance with one embodiment of the invention.

FIG. 4*a* is a snapshot of a scanning transmission electron microscopy line scan 214 of the portion of the magnetic head of FIG. 2*a* using the high angle annular dark field (HAADF) detector of the STEM, where a third reference line 216 with a preselected length substantially the same as that of FIG. 3*a* has been placed such that it crosses the same preselected feature (e.g., thin film stack) 202 of the magnetic head at a different location than the location of the reference lines of FIG. 2a and FIG. 3a (202, 210) in accordance with one embodiment of the invention.

Figure 4B:
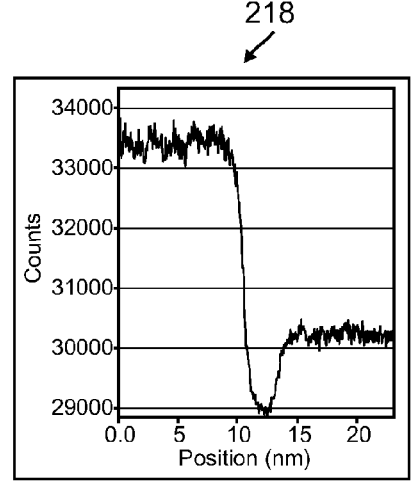

FIG. 4b is a graph of a gray level profile 218 corresponding to the STEM line scan 214 of FIG. 4a.

Referring now to FIGS. 2a through 4b, an application of processes for spatially resolved alignment of independent spectroscopic data from a scanning transmission electron microscope such as the process of FIG. 1 is illustrated. With reference to the reference line 202 drawn in FIG. 2a, a longer reference line, the second reference line 210, was placed over the same location in FIG. 3a, and a line of the same size as the second reference line 210, the third reference line 216, was placed over a different location of the same sample, as shown in FIG. 4a. Looking at FIG. 2a and FIG. 3a first, one can see that there is about a 10 nanometer (nm) section between about 8 nm and about 18 nm in the HAADF profile 212 in FIG. 3b that corresponds exactly, or to a high degree of correlation, to the HAADF profile 206 in FIG. 2b. Therefore, with proper processing of this data, the profile 212 in FIG. 3b can be cropped to match the profile 206 in FIG. 2b with high accuracy.

So as an example application of the process of FIG. 1, FIG. 2a could be thought of as representing a first scan 200 (e.g., line scan) of a thin film stack 204 (e.g., first preselected area) of a first sample (portion of a magnetic head containing the thin film stack 204) using a STEM configured to capture a first preselected signal (e.g., EELS or XEDS signals) with a HAADF image profile 206. In such case, FIG. 3a could represent a second scan 208 (e.g., line scan) of a thin film stack 204 (e.g., second preselected area) of a second sample (portion of same magnetic head containing the thin film stack 204) using a STEM configured to capture a second preselected signal (e.g., EELS or XEDS signals) with a HAADF image profile 212. In such case, the process could select a region of interest from either of the profiles (206, 212) such as the 10 nm section between about 8 nm and about 18 nm in the HAADF profile 212. The process could correlate the selected subset region (e.g., profile 206) by matching it to the other (e.g., non-selected) profile 212 and select, based on the correlation, a portion of the profile 212 (e.g., the 10 nm section between about 8 nm and about 18 nm) such that the portions of the first profile 206 and the second profile 212 are about equal.

The same principle applies to FIG. 4b with respect to FIG. 2b, where the HAADF profiles 206 and 218 from different regions can also be matched. As a result, the spectroscopic data aggregated to the line scans (206, 212, 218) can be readily matched and analyzed comparatively. One can, for instance, characterize the elemental distribution of a film, using this data, as it grows from the substrate at different areas of the sample. In such case, one can assess the uniformity, corrosion, foreign elements, and/or other such characteristics.

Figure 5A:
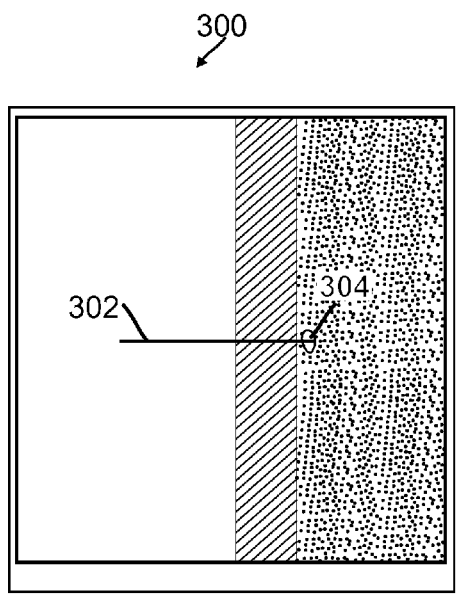
FIG. 5a is a snapshot of a scanning transmission electron microscopy line scan of a portion of a magnetic head using the high angle annular dark field (HAADF) detector of the STEM, where a reference line with a preselected length has been placed such that it crosses a preselected fiducial mark introduced into the line scan in accordance with one embodiment of the invention.

FIG. 5a is a snapshot of a scanning transmission electron microscopy line scan 300 of a portion of a magnetic head using the high angle annular dark field (HAADF) detector of the STEM, where a reference line 302 with a preselected length has been placed such that it crosses a preselected fiducial mark 304 introduced into the line scan 300 in accordance with one embodiment of the invention.

Figure 5B:
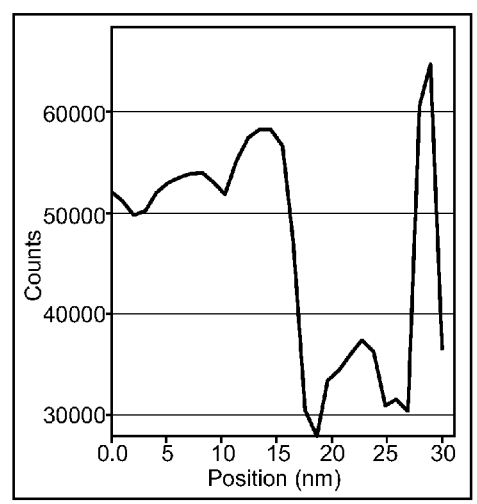

FIG. 5b is a graph of a gray level profile 306 corresponding to the STEM line scan 300 of FIG. 5a.

Figure 6A:
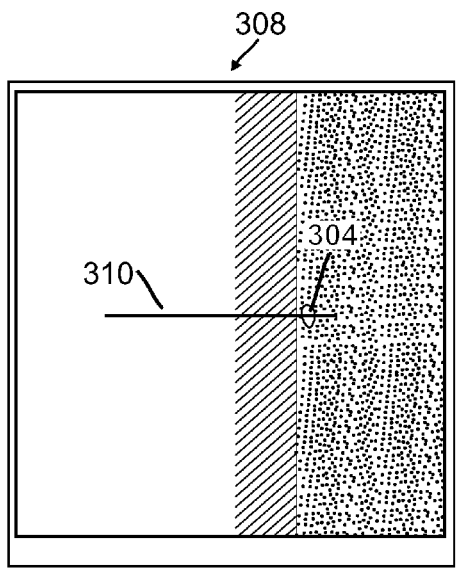
FIG. 6a is a snapshot of a scanning transmission electron microscopy line scan of the portion of the magnetic head of FIG. 5a using the high angle annular dark field (HAADF) detector of the STEM, where a second reference line with a preselected length longer than that of FIG. 5a has been placed such that it crosses the same preselected fiducial mark introduced into the line scan of FIG. 5a in accordance with one embodiment of the invention.

FIG. 6a is a snapshot of a scanning transmission electron microscopy line scan 308 of the portion of the magnetic head of FIG. 5a using the high angle annular dark field (HAADF) detector of the STEM, where a second reference line 310 with a preselected length longer than that of FIG. 5a has been placed such that it crosses the same preselected fiducial mark 304 introduced into the line scan 300 of FIG. 5a in accordance with one embodiment of the invention.

Figure 6B:
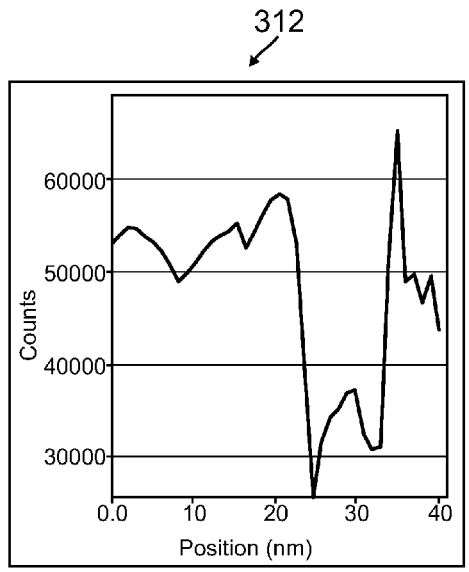

FIG. 6b is a graph of a gray level HAADF profile 312 corresponding to the STEM line scan 308 of FIG. 6a.

Referring now to FIGS. 5a through 6b, the experiment illustrated (e.g., second example application of the process of FIG. 1) involves two line scans (300, 308) where each one is optimized for the acquisition of EELS signals from a different energy range: (i) one between the end of the low-loss regime for about 100 electron volts (eV) and about 1000 eV for scan 300, and (ii) one between about 1000 eV and about 2000 eV for scan 308. The line scans (300, 308) were acquired and recombined following the process outlined in FIG. 1 above. The center of a bright spot 304 on the right end of the line scan was used as reference feature (e.g., fiducial mark). This made the placement of the second reference line 310, the longer of the two reference lines, very straightforward. This bright spot 304 was intentionally produced by exposing that region to a high intensity electron beam of a higher dose than that used in the spectroscopic experiment itself. The methodology employed in FIGS. 5a to 6b is highlighted here to demonstrate the case where a reference feature is difficult to find in the image. In such case, a fiducial mark can be created on the sample.

Following the method for acquisition and recombining of two spectroscopic experiments, the two line scans were acquired separately and recombined by matching their corresponding HAADF profiles (306, 312). The two separate line scans (300, 308) are shown in FIG. 5a and FIG. 6a, respectively. To perform this step in an automated manner, a Matlab script that reads both HAADF profiles (306, 312) and outputs the exact section of, in this case, the profile 312 of the second line scan 308 to be cropped so that the cropped segment matches exactly the profile 306 of the first line scan 300. In other embodiments, other suitable programming or scripting languages can be used. In other embodiments, the segment matching can be less than exact (e.g., approximate).

Figure 7:
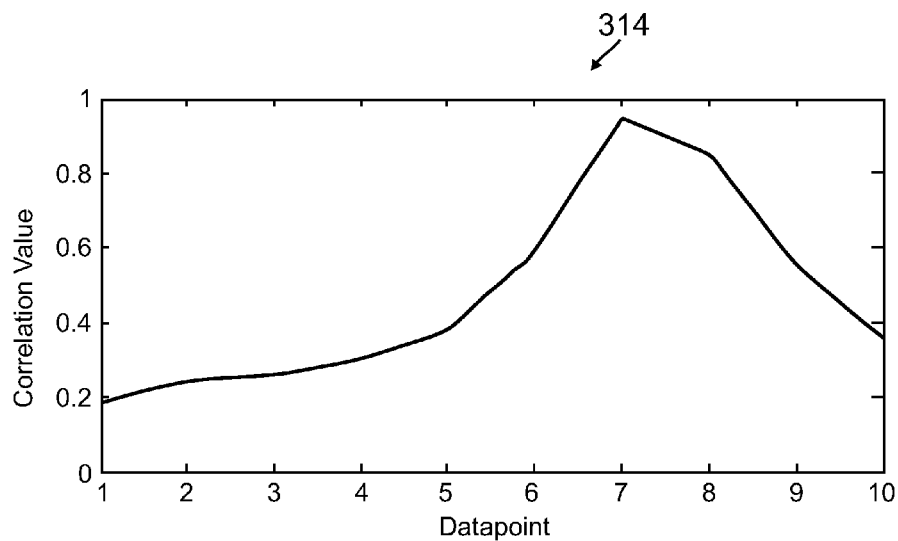
FIG. 7 is a correlation coefficient plot that is based on a comparison of the HAADF profiles of FIGS. 5b and 6b where the smaller profile of FIG. 5a was compared with all possible segments of the larger profile of FIG. 6b having the same size as the smaller profile in accordance with one embodiment of the invention.

FIG. 7 is a correlation coefficient plot 314 that is based on a comparison of the HAADF profiles (306, 312) of FIGS. 5b and 6b where the smaller profile 306 of FIG. 5b was compared with all possible segments of the larger profile 312 of FIG. 6b having the same size as the smaller profile 306 in accordance with one embodiment of the invention. The vertical axis represents a correlation value while the horizontal axis represents a data point (where each data point represents one of the possible segments of the larger profile 312). One of the segments of the larger profile 312 will have the highest correlation, or stated another way will match accurately the smaller profile 306 (e.g., see data point number 7 along the horizontal axis of FIG. 7 with what appears to be the highest correlation score on the vertical axis). In several embodiments, this profile matching method can be used within the context of the present strategy to recombine separately acquired line scan results. Note also that in case of two profiles (or line scans) of the same size, one of them can be easily cropped in a separate step such that the process starts off with both a smaller profile and a larger profile for successful recombining using the offline script (e.g., Matlab script).

Figure 8:
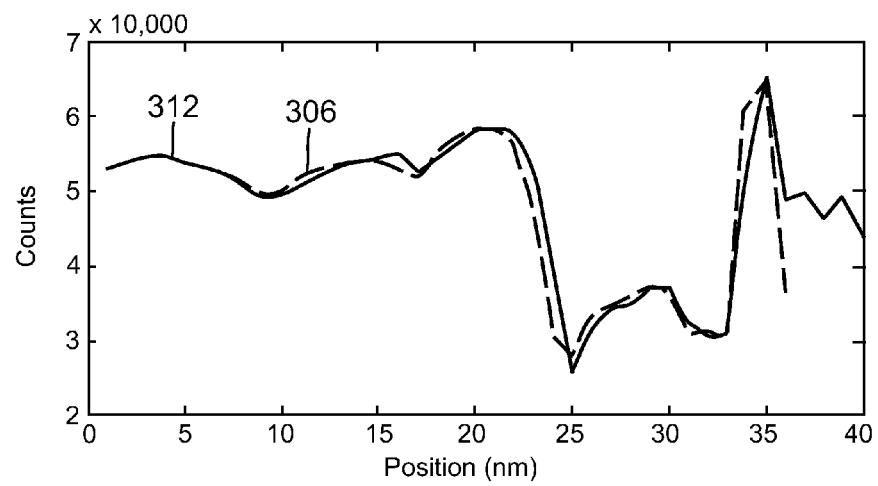
FIG. 8 is a graph of the HAADF profiles of FIGS. 5b and 6b where the smaller profile of FIG. 5b has been superimposed on the larger profile of FIG. 6b to illustrate where the larger profile might be cropped to match the smaller profile in accordance with the correlation plot of FIG. 7.

FIG. 8 is a graph of the HAADF profiles (306, 312) of FIGS. 5b and 6b where the smaller profile 306 of FIG. 5b has been superimposed on larger profile 312 of FIG. 6b to illustrate where the larger profile 312 might be cropped to match the smaller profile 306 in accordance with the correlation plot of FIG. 7. After the larger line scan profile 312 is cropped, two equivalent HAADF profiles of the same size remain, and each of them corresponds to a series of EELS spectra containing the information of two different energy loss ranges of the spectrum for the same region of the sample encompassed by the line scans. Therefore, one can now directly compare the spectroscopic information embedded in the matched line scans, for (a) 100 eV to 1000 eV, and (b) 1000 eV to 2000 eV. The line scans were performed across the cross-sectioned DLC layer of a magnetic head, and thus subsequent processing can reveal the compositional profile of the Ni—Fe substrate, the DLC layer, a protective Cr layer, and a Pt—C layer deposited as part of a focused ion beam TEM lamellae preparation technique. The results of this subsequent processing show good correlation between the edges identified on the 100 to 1000 eV range and those on the higher energy loss regime above 1000 eV.

FIG. 9a is a snapshot of a scanning transmission electron microscopy line scan 400 of a portion of a magnetic head using the high angle annular dark field (HAADF) detector of the STEM, where a reference line 402 with a preselected length has been placed such that it crosses a diamond like carbon (DLC) layer 404 of the magnetic head to analyze the carbon edge structure in accordance with one embodiment of the invention.

FIG. 9b is a graph of a gray level profile corresponding to the STEM line scan of FIG. 9a.

FIG. 10a is a snapshot of a scanning transmission electron microscopy line scan 408 of the portion of the magnetic head of FIG. 9a using the high angle annular dark field (HAADF) detector of the STEM, where a second reference line 410 with a preselected length greater than that of FIG. 9a has been placed such that it crosses the same diamond like carbon (DLC) layer 404 as in FIG. 9a of the magnetic head to analyze the carbon edge structure in accordance with one embodiment of the invention.

FIG. 10b is a graph of a gray level profile 412 corresponding to the STEM line scan of FIG. 10a.

Referring now to FIGS. 9a to 10b, the illustrated experiment (e.g., third example application of the process of FIG. 1) was designed to collect both edge and zero loss peak (ZLP) signals across the DLC layer in order to perform Fourier-ratio deconvolution of the resulting EELS spectra stack while focusing specifically on the carbon edge. Qualitative and quantitative analysis of the near-edge structure contained in the carbon edge reveals chemical bonding information which can be related to the sp3 (stronger) or sp2 (weaker) nature of the bonding and thus can provide insight into the expected performance of the DLC film. However, qualitative and/or quantitative assessment can only be successfully accomplished in a reproducible manner if the effect of plural scattering is removed. Different areas of the same sample, as well as different samples, would have differences in lamellae thickness which, even if only local to the region of interest, would produce variation in the near-edge structure and lead to potential errors in the interpretation/characterization. To minimize these potential detrimental effects for this particular example, it is important to perform deconvolution on the edge regime using information from the low-loss regime.

As shown in FIGS. 9a to 10a, and similar to the experiment shown in FIGS. 5a to 6b, the two line scans (400, 408) were acquired separately, each with the EEL spectrometer configured for a specific range of energy loss, including, for example (i) edge, and (ii) low-loss including the ZLP. These scans and corresponding profiles were acquired in accordance with the processes of FIG. 1 described in detail above. Matching was performed using the same methodology described for the experiment in FIGS. 5a to 6b. The results are shown in FIG. 11 and FIG. 12.

Figure 11:
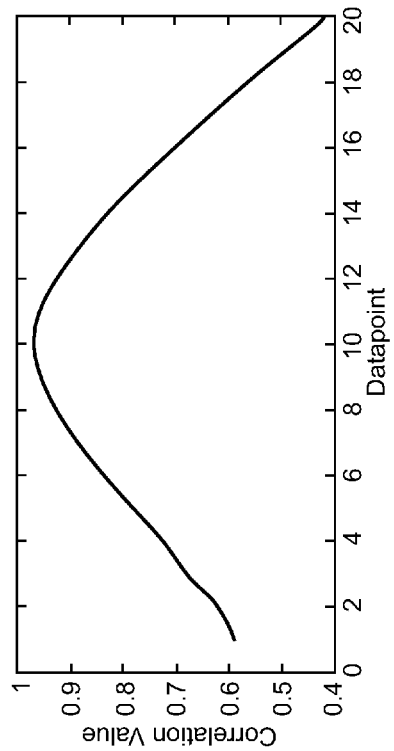
FIG. 11 is a correlation coefficient plot that is based on a comparison of the HAADF profiles of FIGS. 9b and 10b where the smaller profile of FIG. 9b was compared with all possible segments of the larger profile of FIG. 10b having the same size as the smaller profile in accordance with one embodiment of the invention.

FIG. 11 is a correlation coefficient plot 414 that is based on a comparison of the HAADF profiles (406, 412) of FIGS. 9b and 10b where the smaller profile 406 of FIG. 9b was compared with all possible segments of the larger profile 412 of FIG. 10b having the same size as the smaller profile 406 in accordance with one embodiment of the invention. The vertical axis represents a correlation value while the horizontal axis represents a data point (where each data point represents one of the possible segments of the larger profile 412). One of the segments of the larger profile 412 will have the highest correlation, or stated another way will match accurately the smaller profile 406 (e.g., see data point number 10 on the horizontal axis of FIG. 11 with what appears to be the highest correlation score on the vertical axis). In several embodiments, this profile matching method can be used within the context of the present strategy to recombine separately acquired line scan results.

Figure 12:
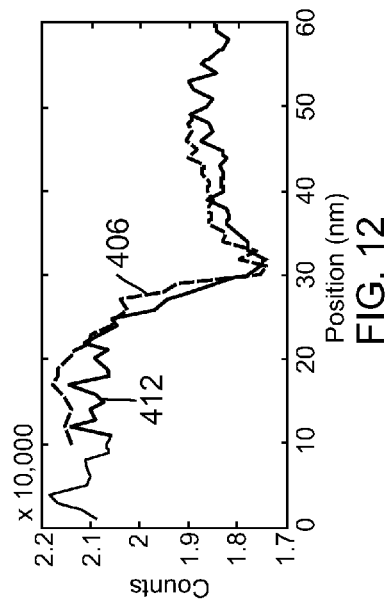
FIG. 12 is a graph of the HAADF profiles of FIGS. 9b and 10b where the profile of FIG. 9b has been superimposed on a selected profile of FIG. 10b after the two profiles have been matched for roughly maximum correlation based on the correlation plot of FIG. 11 in accordance with one embodiment of the invention.

FIG. 12 is a graph of the HAADF profiles (406, 412) of FIGS. 9b and 10b where the smaller profile 406 of FIG. 9b has been superimposed on the larger profile 412 of FIG. 10b to illustrate where the larger profile 412 might be cropped to match the smaller profile 406 in accordance with the correlation plot of FIG. 11.

Figure 13:
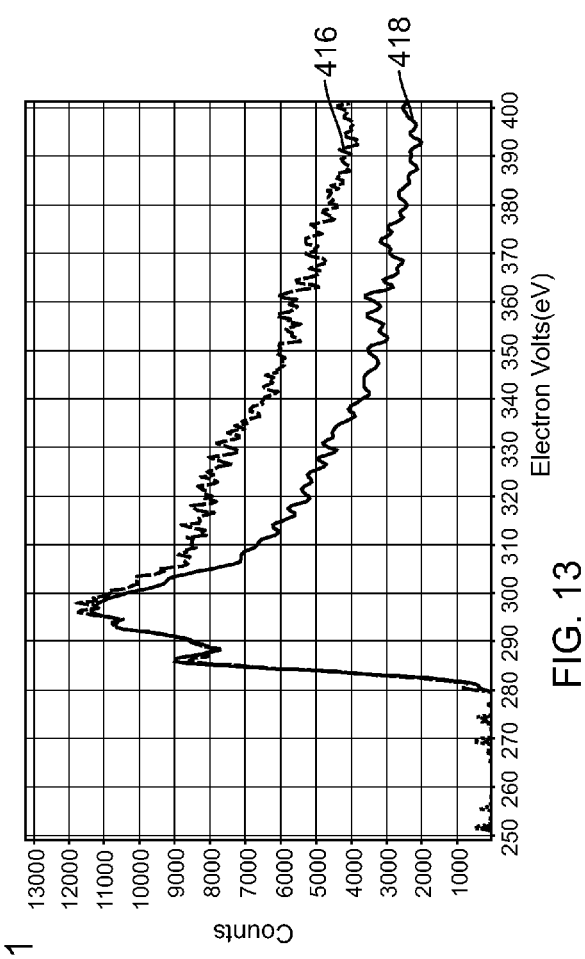
FIG. 13 is a graph indicative of the carbon edge data of FIG. 12 before and after a Fourier-ratio deconvolution was performed on the carbon edge data in accordance with one embodiment of the invention.

FIG. 13 is a graph indicative of the carbon edge data of FIG. 12 before (416) and after (418) a Fourier-ratio deconvolution was performed on the carbon edge data in accordance with one embodiment of the invention. The vertical axis represents the count while the horizontal axis represents energy in electron volts (eV). After matching of the HAADF profiles (406, 412), two spatially resolved sets of spectroscopic data were produced. The Fourier-ratio deconvolution of the carbon edge was performed using the low-loss spectra collected separately in the experiment. The resulting edge after the deconvolution 418 is compared with the same edge before deconvolution (e.g., original signal or 416). The spectrum shown was extracted from the stack of spectra, and is the one that shows the carbon edge with the best signal-to-noise ratio. Note also that the original signal 416 contains a sample thickness artifact, clearly visible at energies above about 295 eV when compared to the deconvoluted signal 418, showing a lower intensity (thickness artifact-free) near edge structure above about 295 eV. The increased intensity of the artifact-containing signal comes from plural scattering of the electron beam as it passes through the sample.

While the above description contains many specific embodiments of the invention, these should not be construed as limitations on the scope of the invention, but rather as examples of specific embodiments thereof. Accordingly, the scope of the invention should be determined not by the embodiments illustrated, but by the appended claims and their equivalents.

What is claimed is:

1. A method for spatially resolving an alignment of spectroscopic data from a scanning transmission electron microscope, the method comprising:

performing a first scan of a first preselected area of a first sample using a scanning transmission electron microscope configured to capture a first preselected signal having a first image profile;

performing a second scan of a second preselected area of a second sample using the scanning transmission electron microscope configured to capture a second preselected signal having a second image profile;

selecting a subset region of interest from one of the first and second image profiles;

correlating the selected subset region of interest from the one of the first and second image profiles and the other of the first and second image profiles, wherein the selected subset region of interest is smaller than the other of the first and second image profiles; and selecting, based on the correlating, a portion of the other of the first and second image profiles such that the selected subset region of interest and the portion of the other of the first and second image profiles are about equal.

2. The method of claim 1, wherein the first sample and the second sample are the same sample.

3. The method of claim 2, wherein the first preselected area and the second preselected area are the same area.

4. The method of claim 2, wherein the first preselected area and the second preselected area comprise a preselected number of common features.

5. The method of claim 1, wherein the first scan is a scan selected from the group consisting of a line scan, a point scan, and an area scan.

6. The method of claim 1, wherein in the first preselected signal and the second preselected signal comprise a plurality of electron energy loss spectroscopy signals.

7. The method of claim 1, wherein in the first preselected signal and the second preselected signal comprise a plurality of energy dispersive x-ray spectroscopy signals.

8. The method of claim 1, wherein the correlating the selected subset region of interest from the one of the first and second image profiles and the other of the first and second image profiles comprises generating an error matrix indicative of a correlation between the one of the first and second image profiles and the other of the first and second image profiles.

9. The method of claim 8, further comprising repeating the method until the error matrix is less than a preselected value.

10. The method of claim 1:
wherein the first scan comprises a first line scan; and
wherein the performing the first scan comprises placing the first line scan across a preselected reference feature of the first sample.

11. The method of claim 10:
wherein the second scan comprises a second line scan;
wherein the performing the second scan comprises placing the second line scan across a preselected reference feature of the second sample;
wherein the first sample and the second sample are the same sample; and
wherein the preselected feature of the first sample and the preselected feature of the second sample are the same preselected feature.

12. The method of claim 11, wherein the preselected reference feature of the first sample comprises an intrinsic feature of the first sample.

13. The method of claim 11, wherein the preselected reference feature of the first sample comprises a non-intrinsic feature of the first sample.

14. The method of claim 13, wherein the non-intrinsic feature comprises a fiducial mark.

15. The method of claim 1:
wherein the first image profile comprises a grayscale contrast profile from a preselected imaging detector of the scanning transmission electron microscope; and
wherein the second image profile comprises a grayscale contrast profile from the preselected imaging detector of the scanning transmission electron microscope.

16. The method of claim 15, wherein the preselected imaging detector comprises a high angle annular dark field detector.

17. The method of claim 1:
wherein the first scan comprises a first line scan comprising a first spatial resolution;
wherein the second scan comprises a second line scan comprising a second spatial resolution; and
wherein the first spatial resolution is about equal to the second spatial resolution.

18. The method of claim 17, wherein the first spatial resolution is equal to the second spatial resolution.

19. The method of claim 1:
wherein the first sample and the second sample are the same sample; and
wherein the first preselected area and the second preselected area are the same area;
wherein the method further comprises:
comparing a spectroscopic information of the selected subset region of interest with a spectroscopic information of the selected portion of the other of the first and second image profiles; and
generating a compositional profile of the first preselected area of the first sample based on a result of the comparing the spectroscopic information of the selected subset region of interest with the spectroscopic information of the selected portion of the other of the first and second image profiles.

20. The method of claim 1:
wherein the first preselected signal comprises a signal selected from the group consisting of a plurality of electron energy loss spectroscopy signals, a plurality of energy dispersive x-ray spectroscopy signals, and a plurality of convergent beam electron diffraction signals;
wherein the second preselected signal comprises a signal selected from the group consisting of a plurality of electron energy loss spectroscopy signals, a plurality of energy dispersive x-ray spectroscopy signals, and a plurality of convergent beam electron diffraction signals.

21. The method of claim 1:
wherein the first preselected signal comprises a signal selected from the group consisting of a plurality of electron energy loss spectroscopy signals, a plurality of energy dispersive x-ray spectroscopy signals, a plurality of convergent beam electron diffraction signals, and combinations thereof;
wherein the second preselected signal comprises a signal selected from the group consisting of a plurality of electron energy loss spectroscopy signals, a plurality of energy dispersive x-ray spectroscopy signals, a plurality of convergent beam electron diffraction signals, and combinations thereof.

* * * * *